Sept. 16, 1969 L. LEWIN ET AL 3,467,911

TUNNEL DIODE CIRCUITS

Filed Jan. 24, 1966

United States Patent Office 3,467,911

Patented Sept. 16, 1969

3,467,911

TUNNEL DIODE CIRCUITS

Leonard Lewin, Kenneth George Hodgson, and Stanley George Allen, London, England, assignors to International Standard Electric Corporation, New York, N.Y., a corporation of Delaware Filed Jan. 24, 1966, Ser. No. 523,014
Int. Cl. H03g 3/30
U.S. Cl. 330—61 3 Claims

ABSTRACT OF THE DISCLOSURE

A tunnel diode amplifier circuit having a controlled gain. A biasing circuit which includes a non-linear electrical device that controls the gain of the tunnel diode responsive to feedback signals obtained from the amplifier output. Maximum bias and minimum gain for the tunnel diode is obtained when the non-linear electrical device has become saturated by the applied feedback signal.

This invention relates to tunnel diode amplifiers.

According to one aspect of the invention there is provided an amplifier having a controlled gain including a tunnel diode biased to the negative resistance portion of its characteristic, in which said gain is controlled in accordance with the amplitude of the output from said amplifier by applying a signal derived from said output to vary the bias of said tunnel diode, and in which the bias that the said gain is reduced with increasing amplitude of said output.

According to another aspect of the invention there is provided an amplifier having a controlled gain, comprising a tunnel diode, in which said gain is controlled in accordance with the amplitude of the output from said amplifier by applying a signal derived from said output to vary the bias of said tunel diode, and in which the bias of said tunnel diode is varied under control of a biasing circuit including a non-linear electrical device.

Figure 1:
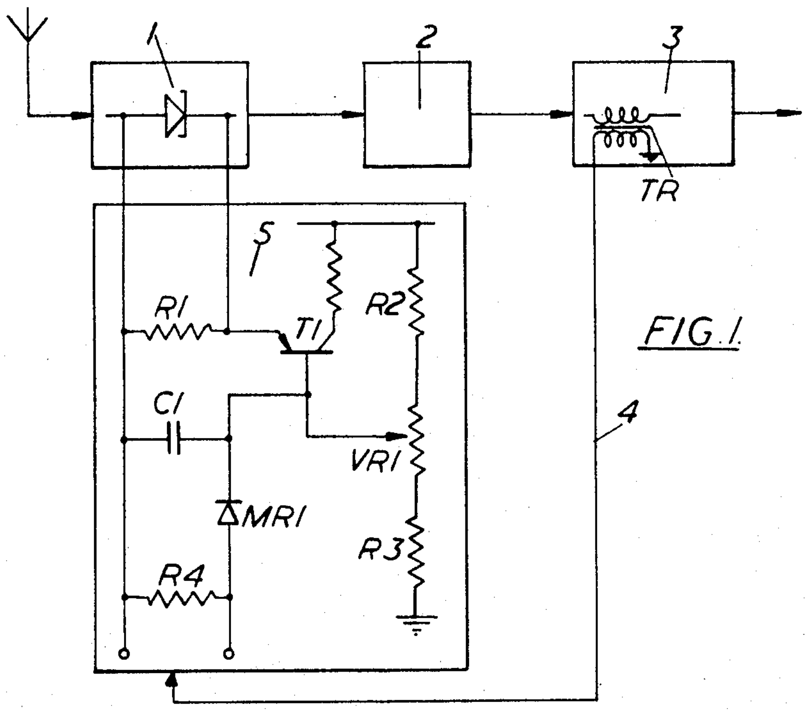
Figure 2:
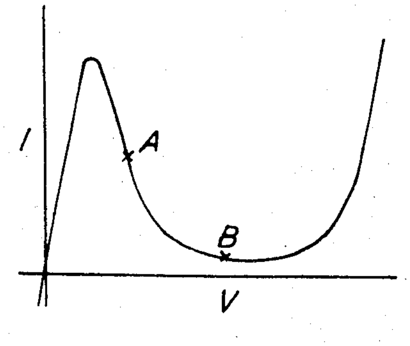
Figure 3:
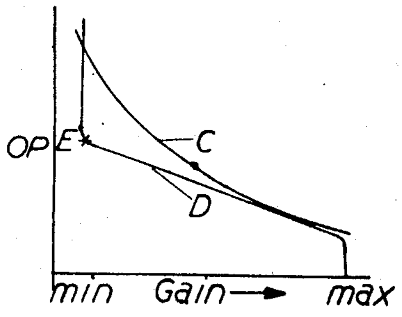

A preferred embodiment of the invention will now be described with reference to the accompanying drawings, in which:

FIG. 1 is a part schematic part circuit diagram of a microwave link comprising a multichannel receiver incorporating a tunnel diode amplifier, FIG. 2 shows the static current/voltage characteristic of a tunnel diode, FIG. 3 shows the output/gain characteristic of the amplifier of FIG. 1 and a required characteristic to avoid excessive intermodulation products.

Three stages of the receiver shown in FIG. 1 comprise a RF tunnel diode amplifier 1, a mixer 2 and an IF amplifier 3. A feedback path 4 is provided between the IF amplifier 3 and a bias control circuit 5 for the tunnel diode amplifier 1.

The requirements of tunnel diode amplifiers when used as low noise amplifiers on microwave links may be summarised as set out below. They are required to:

(a) Produce a low noise contribution, e.g. 5 db, when input signals are at their lowest expected level, (b) Have sufficient gain that the overall noise performance is not seriously degraded by the noise of the next (mixer) stage, (c) Work on a sufficiently linear part of their characteristic to keep intermodulation products at an adequately low level, even when input signals are at their highest expected level, (c) Cope with input signals covering a range of levels due to fading.

A typical second stage noise figure might be 10 db, and if this is preceded by a tunnel diode amplifier with a noise figure of 5 db, a gain of 15 db the overall noise figure would be about 5½ db.

A typical input signal level is −35 dbm (for a 960 channel link) which might fade by 20 to 30 db, or encounter a negative fade of about 5 db.

Signals from adjacent channels on either side may reach the amplifier input at a level 20 db down on the wanted signal, and third order intermodulation products at the output of the tunnel diode amplifier need to be kept below a specified level, such as −65 db below the output signal.

Since a typical output level of a tunnel diode amplifier may be, for example, only −24 dbm it is apparent that at the high input signal level, non-linearities in the amplifier may cause excessive intermodulation.

Thus, when the input signal level is high, so that the noise contribution of the amplifier is relatively unimportant, it would be satisfactory to have an amplifier of low gain, for example, 6 db only. On the other hand, when the signal is weak a higher gain is desirable, e.g. 15 db.

Maximum gain of a tunnel diode amplifier is obtained by biasing the tunnel diode to the point A of the characteristic shown in FIG. 2, the point A being the point of inflection of the negative resistance region. The gain is reduced by altering the bias into the valley region of the characteristic as indicated by the point B.

In FIG. 3, curve C represents the −65 db output level separation between the wanted signal and signals produced by intermodulation from adjacent channels, for input signal levels varying between maximum and minimum, while curve D represents the output/gain characteristic of the tunnel diode amplifier for values of tunnel diode bias varying between maximum and minimum.

It will be seen that at point E on curve D, when the minimum value of gain (corresponding to maximum bias) is reached, the output level may be permitted to rise somewhat at a fixed value of minimum gain, before the −65 db separation curve is crossed.

The realisation of the curve D characteristic is achieved by the bias control circuit 5 of FIG. 1. The control circuit 5 provides a bias for the tunnel diode amplifier 1 according to the potential drop across a resistance R1 connected across the tunnel diode. The resistor R1 serves as the required positive value stabilising resistance for the tunnel diode, and also as the emitter load resistance of a transistor T1. The current flowing through the collector-emitter-load (R1) path determines the bias on the tunnel diode amplifier 1, and the tunnel diode is biased to maximum gain (minimum bias) by an appropriate setting of a variable resistance VR1 in the base biassing potential divider R2, VR1, R3 for the transistor T1. At this setting minimum current flows through the resistance R1 and accordingly maximum gain is attained.

Variation of the bias on the tunnel diode according to the level of the output signal therefrom is controlled by the feedback path 4 feeding back via transformer TR in the IF stage 3 a portion of the output signal to the control circuit. This feedback may alternatively be derived direct from the amplifier output or from any other stage.

A resistance R4 is provided as a terminating resistance to match the characteristic impedance of the feedback path 4, and the feedback signal is rectified by rectifier MR1, smoothed by capacitor C1, applied to the base of the transistor T1, varying the base bias and accordingly varying the current flowing through the resistance R1. As a result of this, the tunnel diode bias is varied with the level of the output signal to vary the gain accordingly.

The gain of the transistor T1 determines the slope of the gain characteristic of the tunnel diode between the maximum and minimum values. The higher the gain of the transistor the flatter the slope, and conversely the lower the gain of the transistor the steeper the slope.

Maximum value of the bias is determined when the current applied to the base of the transistor T1 from the feedback path causes the transistor to saturate.

When this occurs, the bias cannot be further increased as no additional current can flow through the resistance R1, and the tunnel diode then operates with a constant minimum gain, corresponding to the vertical portion of the curve D above the point E of FIG. 3.

The tunnel diode bias may be varied by other forms of non-linear electrical device than a transistor, for example a thermistor may be used.

What we claim is:

1. A tunnel diode amplifier having controlled gain, biasing circuit means for biasing said tunnel diode to the negative resistance portion of the characteristic curve thereof, said biasing circuit means comprising a current amplifying saturable device, said biasing circuit means further comprising biasing resistor means bridging the tunnel diode of said tunnel diode amplifier, whereby increased current through said biasing resistor decreases the gain of said tunnel diode, means for coupling the current amplifying saturable device between the output side of said biasing resistor means, and ground so that said device controls the current flow through said biasing resistor thereby controlling the gain of the tunnel diode, and means for feeding back a portion of the said tunnel diode amplifier to control said current amplifying saturable device to saturate at a desired point of increased output of said tunnel diode amplifier thereby limiting the minimum gain of said tunnel diode amplifier.

2. The amplifier of claim 1 wherein said current amplifying saturable device comprises a transistor, means for coupling the output side of said biasing resistor to the emitter of said transistor, a feedback path including diode means for feeding back a portion of the output signal of said tunnel diode amplifier means to the base of said transistor, and divider circuitry for biasing the base of said transistor to obtain minimum tunnel diode gain when the signal applied to the base of the transistor from the feedback path causes the transistor to saturate.

3. The tunnel diode amplifier of claim 1 wherein the collector of said transistor is coupled to ground through said divider circuitry, said divider circuitry comprising variable resistor means, means for coupling said base to the wiper of said variable resistor so that with no feedback signal the current flow through said transistor is minimal and the gain of said tunnel diode amplifier is maximum.

References Cited

UNITED STATES PATENTS

| | | | |
|---|---|---|---|
| 2,999,169 | 9/1961 | Feiner | 330—29 X |
| 3,019,396 | 1/1962 | Heine et al. | 330—29 X |
| 3,109,989 | 11/1963 | Muir | 330—29 X |
| 3,119,080 | 1/1964 | Waters | 330—61 X |
| 3,187,266 | 6/1965 | Marshall | 330—61 X |

NATHAN KAUFMAN, Primary Examiner

U.S. Cl. X.R.

330—29; 307—251, 304